United States Patent [19]

Umeki

[11] Patent Number: 4,694,198
[45] Date of Patent: Sep. 15, 1987

[54] SCHMITT TRIGGER CIRCUIT

[75] Inventor: Yoshitaka Umeki, Tokyo, Japan

[73] Assignee: NEC Corporation, Tokyo, Japan

[21] Appl. No.: 890,263

[22] Filed: Jul. 29, 1986

[30] Foreign Application Priority Data

Jul. 29, 1985 [JP] Japan .................................. 60-167346

[51] Int. Cl.[4] ........................................... H03K 3/295
[52] U.S. Cl. ..................................... 307/290; 307/359
[58] Field of Search ................ 307/359, 290; 328/206, 328/200, 203

[56] References Cited

U.S. PATENT DOCUMENTS 4,219,744 8/1980 Shinn, II ............................. 307/290
4,408,132 10/1983 Kuwahara ........................... 307/290

OTHER PUBLICATIONS

P. R. Epley et al., "Schmitt Trigger Circuit" IBM Technical Disclosure Bulletin, vol. 16, No. 5, Oct. 1973, pp. 1600–1601.

Primary Examiner—John Zazworsky
Attorney, Agent, or Firm—Sughrue, Mion, Zinn, Macpeak and Seas

[57] ABSTRACT

A Schmitt trigger circuit comprising input and output terminals, first and second voltage supply lines, a first transistor having its base connected to the input terminal and its the collector connected to the first voltage supply line though a load resistor, a second transistor having its collector connected to the first voltage supply line, a first constant-current source through which the first and second transistors have their respective emitters commonly connected to the second supply voltage line, and a third transistor having its collector connected to the first voltage supply line, its base connected to the first voltage supply line through the load resistor and to the collector of the first transistor and its emitter connected to the base of the second transistor. There is further provided a second constant-current source through which the third transistor has its base further connected to the second voltage supply line.

6 Claims, 4 Drawing Figures

SCHMITT TRIGGER CIRCUIT

FIELD OF THE INVENTION

The present invention relates to a Schmitt trigger circuit which can be easily implemented in a semiconductor integrated circuit while providing accurately controlled forward and reverse threshold levels for the input voltage of the trigger circuit.

DESCRIPTION OF THE PRIOR ART

FIG. 1 of the drawings shows an example of a prior-art Schmitt trigger circuit to which the present invention generally appertains. As shown, the prior-art Schmitt trigger circuit is in the form of an emitter-coupled logic composed of a plurality of bipolar transistors. The Schmitt trigger circuit has a high-voltage supply line 10 connected to a source of a certain high-level supply voltage $V_{CC}$ and a low-voltage supply line 12 connected to a source of a certain low-level supply voltage $V_{EE}$. Typically, the high-voltage supply line 10 is connected to ground and the low-voltage supply line 12 connected to a supply voltage of the negative polarity. The transistors forming the emitter-coupled logic are provided between these high-voltage and low-voltage supply lines 10 and 12 and include first, second, third and fourth transistors 14, 16, 18 and 20 each of which is of the n-p-n type.

The first and second transistors 14 and 16 have their respective collectors connected to the high-voltage supply line 10 through load resistors 22 and 24, respectively, and their respective emitters commonly connected to the low-voltage supply line 12 through a constant-current network 26 for the supply of a constant current $I_C$. The first transistor 14 in particular has its base connected to an input terminal 28 at which a variable input voltage $V_{IN}$ is to appear. The constant-current network 26 is shown comprising an n-p-n transistor 30 having its collector connected to the respective emitters of the transistors 14 and 16. The transistor 30 further has its emitter connected through a resistor 32 to the low-voltage supply line 12 and its base connected to a bias voltage supply terminal 34 as shown.

The third transistor 18 has its collector connected directly to the high-voltage supply line 10, its base connected to the voltage supply line 10 through the resistor 22 and its emitter connected to the base of the second transistor 16 and through a resistor 36 to the low-voltage supply line 12. Furthermore, the fourth transistor 20 has its collector connected directly to the high-voltage supply line 10, its base connected to the voltage supply line 10 through the resistor 24 and its emitter connected through a resistor 38 to the low-voltage supply line 12. Between the resistor 38 and the emitter of the fourth transistor 20 is provided a node connected to an output terminal 40 at which a voltage of either a high level or a low level is to appear as an output voltage $V_{OUT}$ of the Schmitt trigger circuit.

In the presence of a voltage $V_{IN}$ of a low level "L" at the input terminal 28 of the Schmitt trigger circuit thus constructed and arranged, the first transistor 14 is turned off so that the third transistor 18 and accordingly the second transistor 16 remain in conduction states. The fourth transistor 20 is thus maintained in a non-conduction state so that a voltage $V_{OUT}$ of a low level is established at the output terminal 40 of the Schmitt trigger circuit. Under these conditions, only a negligible base-emitter current of the third transistor 18 flows through the resistor 22 so that the potential at the base of the third transistor 18 is approximately equal to the supply voltage $V_{CC}$. Thus, the forward threshold level $V_T^+$ of the input voltage $V_{IN}$ of the Schmitt trigger circuit depends solely on the base-emitter voltage $V_{BE3}$ of the third transistor 18 and is given by $$V_T^+ = V_{CC} - V_{BE3}. \qquad \text{Eq. 1}$$

As the voltage $V_{IN}$ at the input terminal 28 of the Schmitt trigger circuit rises with respect to the potential at the common emitters of the first and second transistors 14 and 16, a current begins to flow through the collector of the transistor 14. This results in a decrease in the voltage at the base of the third transistor 18 and accordingly in the current flowing through the emitter of the transistor 18. It therefore follows that the potential at a node M between the emitter of the third transistor 18 and the base of the second transistor 16 begins to drop to give rise to a decrease in the voltage at the base of the second transistor 16. The decrease in the base voltage of the second transistor 16 in turn results in a decrease in the collector current of the transistor 16. When the voltage $V_{IN}$ at the input terminal 28 reaches the forward threshold level $V_T^+$, the first transistor 14 turns on. The second transistor 16 being turned off, the fourth transistor 20 is permitted to turn on and establishes a voltage of a high level "H" at the output terminal 40 of the Schmitt trigger circuit. Under these conditions, the constant current $I_C$ flowing through the resistor 22 to the first transistor 14 so that the reverse threshold level $V_T^-$ of the input voltage $V_{IN}$ of the Schmitt trigger circuit is given by $$V_T^- = V_{CC} - (I_C R_1 + V_{BE3}), \qquad \text{Eq. 2}$$

where $R_1$ is the resistance value of the resistor 22. From Eqs. 1 and 2, the hysteresis range $V_H$ between the forward and reverse threshold levels $V_T^+$ and $V_T^-$ of the input voltage $V_{IN}$ is given by $$V_H = V_T^+ - V_T^- = I_C R_1. \qquad \text{Eq. 3}$$

Eq. 2 shows that the reverse threshold voltage $V_T^-$ at the input terminal 28 of the circuit can be adjusted by varying the resistance $R_1$ of the resistor 22 as well as the constant current $I_C$ supplied from the constant-current network 26. The constant current $I_C$ from the network 26 may be adjusted by varying the bias voltage at the terminal 34 and/or the resistane value of the resistor 32. From Eq. 2, however, it is seen that the forward threshold voltage $V_T^+$ depends solely on the base-emitter voltage $V_{BE3}$ of the third transistor 18 and can not be selected arbitrarily.

It is, accordingly, a prime object of the present invention to provide an improved Schmitt trigger circuit in which not only the reverse threshold level but also the forward threshold level of the input voltage can be selected arbitrarily.

SUMMARY OF THE INVENTION

In accordance with one outstanding aspect of the present invention, there is provided a Schimitt trigger circuit comprising
 (a) an input terminal,
 (b) an output terminal,
 (c) a first voltage supply line at which a first predetermined voltage is to be established, (d) a second voltage supply line at which a second predetermined voltage is to be established, (e) a first transistor having its base connected to the input terminal, (f) a load resistor through which the first transistor has its the collector connected to the first voltage supply line, (g) a second transistor having its collector connected to the first voltage supply line, (h) first constant-current source means through which the first and second transistors have their respective emitters commonly connected to the second supply voltage line, (i) a third transistor having its collector connected to the first voltage supply line, its base connected to the first voltage supply line through the load resistor and to the collector of the first transistor and its emitter connected to the base of the second transistor, and (j) second constant-current source means through which the third transistor has its base further connected to the second voltage supply line. If desired, there may be further provided a resistor connected between the second constant-current source means and each of the load resistor and the collector of the first transistor.

In accordance with another outstanding aspect of the present invention, there is provided a Schmitt trigger circuit comprising (a) an input terminal;

(b) an output terminal;

(c) a first voltage supply line for supplying a first predetermined voltage;

(d) a second voltage supply line for supplying a second predetermined voltage;

(e) a first transistor having its base connected to the input terminal, a collector and an emitter;

(f) a first load resistor connected between the collector of the first transistor and the first voltage supply line;

(g) a second transistor having a collector connected to the first voltage supply line, an emitter and a base;

(h) a second load resistor connected between the collector of the second transistor and the first voltage supply line;

(i) a first constant-current source connected between the respective emitters of the first and second transistors and the second supply voltage line;

(j) a third transistor having a collector connected to the first voltage supply line, a base connected to the first load resistor and to the collector of the first transistor and an emitter connected to the base of the second transistor, (k) a fourth transistor having a collector connected to the first voltage supply line, a base connected to the collector of the second transistor and an emitter;

(l) a second constant-current source connected between the base of the third transistor and the second voltage supply line; and (m) means for connecting one of the respective emitters of the third and fourth transistors to the aforesaid output terminal.

In a Schmitt trigger circuit according to the present invention, the first constant-current source may comprise a transistor having its collector connected to the respective emitters of the first and second transistors, its emitter connected through a resistor to the second voltage supply line and its base connected to a source of a predetermined bias voltage and the second constant-current source means may comprise a transistor having its collector connected to the first voltage supply line through the load resistor, its emitter connected through a resistor to the second voltage supply line and its base connected to a source of a predetermined bias voltage.

A Schmitt trigger circuit according to the present thus constructed is advantageous, inter alia, in that the forward threshold level of the input voltage of the trigger circuit can be adjusted arbitrarily by selecting one or both of the resistance of the resistor or each of the first and second load resistors and the constant current to be supplied from the second constant-current network. A Schmitt trigger circuit according to the present invention is further advantageous in that the trigger circuit permits of arbitrary adjustment of the reverse threshold level of its input voltage by selecting any one or ones of the resistance of the load resistor or each of the first and second load resistors and the current to flow through the load resistor or each of the first and second load resistors. It will thus be seen that not only the reverse threshold level but also the forward threshold level of the input voltage can be selected arbitrarily in a Schmitt trigger circuit according to the present invention.

Furthermore, a Schmitt trigger circuit in accordance with the second outstanding aspect of the present invention has an additional advantage that the hysteresis range between the forward and reverse threshold levels of the input voltage of the circuit can also be adjusted arbitrarily by varying the resistance value of the additional resistor 48 as well as the forward and reverse threshold levels of the input voltage.

BRIEF DESCRIPTION OF THE DRAWINGS

The features and advantages of a Schmitt trigger circuit according to the present invention will be more clearly appreciated from the following description taken in conjunction with the accompanying drawings in which like reference numerals designate similar or corresponding elements and units and in which.

DESCRIPTION OF THE PREFERRED EMBODIMENTS

Figure 1:
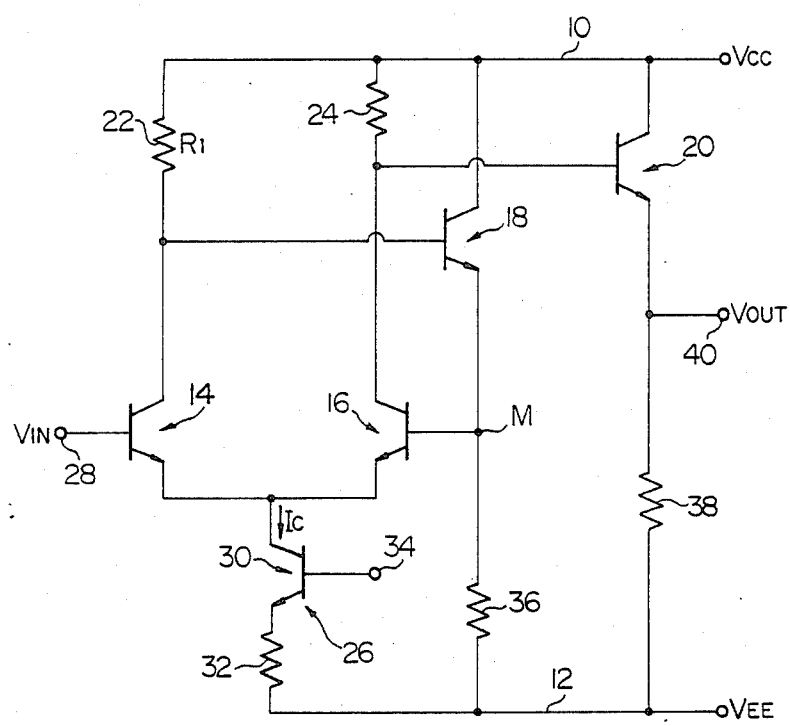
FIG. 1 is a diagram showing the circuit arrangement of a representative example of a prior-art Schmitt trigger circuit of the type to which the present invention generally appertains.
Figure 2:
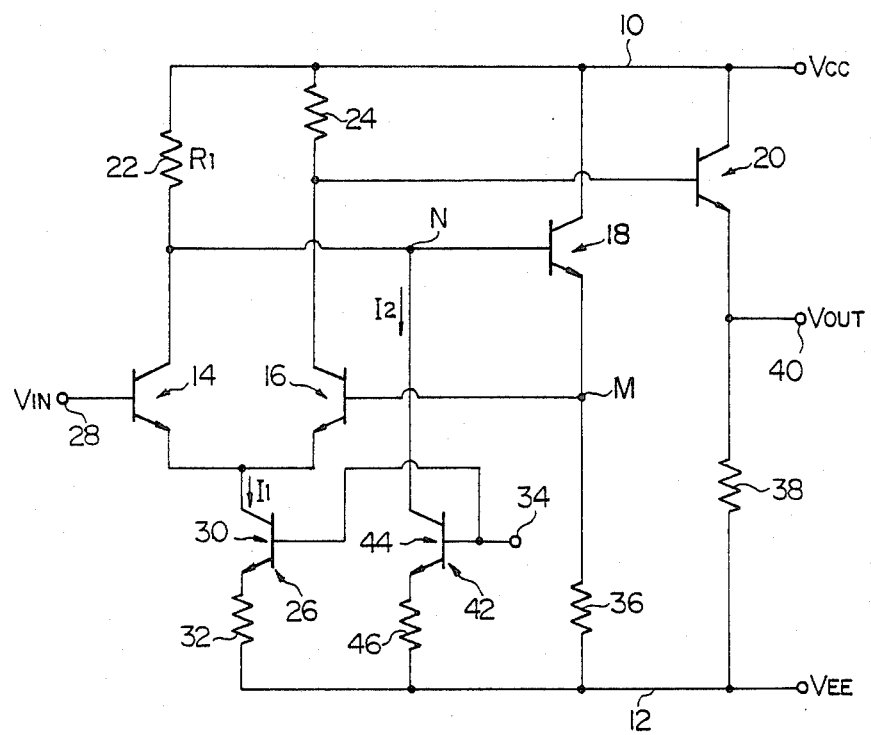
FIG. 2 is a diagram showing the circuit arrangement of a preferred embodiment of a Schmitt trigger circuit according to the present invention.

Referring to FIG. 2 of the drawings, a Schmitt trigger circuit embodying the present invention is also provided in the form of an emitter-coupled logic. The Schmitt trigger circuit embodying the present invention is shown comprising first, second, third and fourth transistors 14, 16, 18 and 20 arranged between a high-voltage supply line 10 connected to a source of a certain high-level supply voltage $V_{CC}$ and a low-voltage supply line 12 connected to a certain low-level supply voltage $V_{EE}$. The high-voltage supply line 10 is typically connected to ground and the low-voltage supply line 12 typically connected to a supply voltage of the negative polarity. Furthermore, each of the transistors 14, 16, 18 and 20 is assumed to be of the bipolar n-p-n type.

The first and second transistors 14 and 16 have their respective collectors connected to the high-voltage supply line 10 through load resistors 22 and 24, respectively, and their respective emitters commonly connected to the low-voltage supply line 12 through a constant-current network 26 which is operative to supply a predetermined constant current $I_1$. The first transistor 14 in particular has its base connected to an input terminal 28 at which a variable input voltage $V_{IN}$ is to appear. The constant-current network 26 is shown comprising an n-p-n transistor 30 having its collector connected to the respective emitters of the first and second transistors 14 and 16. The transistor 30 further has its emitter connected through a resistor 32 to the low-voltage supply line 12 and its base connected to a suitable bias voltage supply terminal 32 as shown. The constant current $I_1$ to be supplied from the network 26 may be adjusted by varying the bias voltage at the terminal 34 and/or the resistance value of the resistor 32. The third transistor 18 has its collector connected directly to the high-voltage supply line 10, its base connected to the voltage supply line 10 through the resistor 22 and its emitter connected to the base of the second transistor 16 and through a resistor 36 to the low-voltage supply line 12. Furthermore, the fourth transistor 20 has its collector connected directly to the high-voltage supply line 10, its base connected to the voltage supply line 10 through the resistor 24 and its emitter connected through a resistor 38 to the low-voltage supply line 12. Between the resistor 38 and the emitter of the fourth transistor 20 is provided a node connected to an output terminal 40 at which a voltage of either a high level or a low level is to appear as an output voltage $V_{OUT}$ of the Schmitt trigger circuit.

In the Schmitt trigger circuit embodying the present invention, there is further provided a second constant-current network 42 in addition to the first constant-current network 26 operative to supply a predetermined constant current $I_2$. The second constant-current network 42 is shown comprising an n-p-n transistor 44 having its collector connected to a node N between the resistor 22 and the base of the third transistor 18 and its emitter connected through a resistor 46 to the low-voltage supply line 12. The transistor 44 further has its base connected to the bias voltage supply terminal 34 to which the base of the transistor 30 forming part of the first constant-current network 26 is connected. The constant current $I_2$ to be supplied from this second constant-current network 42 may also be adjusted by varying the bias voltage at the terminal 34 or the resistance value of the resistor 46.

In the presence of a voltage $V_{IN}$ of a low level "L" at the input terminal 28, the first transistor 14 is turned off and the second transistor 16 turned on so that a voltage $V_{OUT}$ of a low level is established at the output terminal 40 of the Schmitt trigger circuit with the fourth transistor 20 in a non-conduction state. Under these conditions, only the constant current $I_2$ flows through the resistor 22 to the second constant-current network 42 so that the potential at the node M between the emitter of the third transistor 18 and the base of the second transistor 16 depends not only on the base-emitter voltage $V_{BE3}$ of the third transistor 18 but on the voltage across the resistor 22 ($R_1$). Thus, the forward threshold level $V_T^+$ of the input voltage $V_{IN}$ of the Schmitt trigger circuit is given by $$V_T^+ = V_{CC} - (I_2R_2 + V_{BE3}).$$  Eq. 4

As the voltage $V_{IN}$ at the input terminal 28 of the Schmitt trigger circuit rises and becomes positive with respect to the potential at the common emitters of the first and second transistors 14 and 16, a current begins to flow through the collector of the transistor 14. This results in a decrease in the voltage at the base of the third transistor 18 and accordingly in the current flowing through the collector of the transistor 18. It therefore follows that the potential at the node M between the emitter of the third transistor 18 and the base of the second transistor 16 begins to drop to give rise to a decrease in the voltage at the base of the second transistor 16. The decrease in the voltage at the base of the second transistor 16 in turn results in a decrease in the collector current of the transistor 16 and accordingly in an increase in the current flowing into the first transistor 14. When the input voltage $V_{IN}$ at the input terminal 28 reaches the forward threshold level $V_T^+$, the first transistor 14 turns on. The second transistor 16 being turned off, the fourth transistor 20 establishes a voltage of a high level "H" at the output terminal 40 of the Schmitt trigger circuit. Under these conditions, the resistor 22 receives the constant current $I_2$ from the second constant-current network 42 in addition to the constant current $I_1$ from the first constant-current network 26. As a consequence, the reverse threshold level $V_T^-$ of the input voltage $V_{IN}$ of the Schmitt trigger circuit is given by $$V_T^- = V_{CC} - (I_1 + I_2)R_1 + V_{BE3}).$$  Eq. 5

Eqs. 4 and 5 show that the hysteresis range $V_H$ between the forward and reverse threshold levels $V_T^+$ and $V_T^-$ of the $V_{IN}$ voltage of the Schmitt trigger circuit is given by $$V_H = V_T^+ - V_T^- = I_1R_1.$$  Eq. 6

Figure 3:
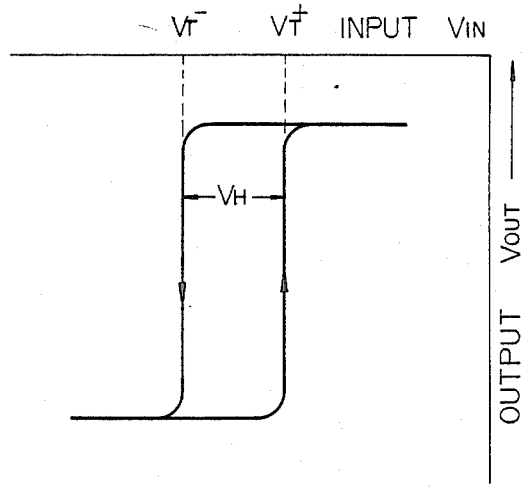
FIG. 3 is a graph which shows a hysteresis loop of the input-output ($V_{IN}-V_{OUT}$) voltage characteristics achieved in the Schmitt trigger circuit illustrated in FIG. 2.

FIG. 3 of the drawings shows a hysteresis loop of the input-output voltage characteristics providing such a hysteresis range $V_H$.

Eq. 4 further shows that the Schmitt trigger circuit embodying the present invention permits arbitrary adjustment of the forward threshold voltage $V_T^+$ by selecting one or both of the resistance $R_1$ of the resistor 22 and the constant current $I_2$ supplied from the second constant-current network 42. Likewise, Eq. 5 further shows that the Schmitt trigger circuit embodying the present invention permits arbitrary adjustment of the reverse threshold voltage $V_T^-$ by selecting any one or ones of the resistance $R_1$ of the resistor 22 and the currents $I_1$ and $I_2$ to flow past the resistor 22. It will thus be seen that not only the reverse threshold level $V_T^-$ but also the forward threshold level $V_T^+$ of the input voltage $V_{IN}$ can be selected arbitrarily in the Schmitt trigger circuit embodying the present invention.

The current $I_2$ to flow past the resistor 22 to the second constant-current network 42 is approximately equal to the emitter current of the transistor 44 forming part of the constant-current network 42. On the other hand, the current $I_1$ to flow past the resistor 22 to the first transistor 14 is approximately equal to the emitter current of the transistor 30 which forms part of the first constant-current network 26. Thus, precise values of the forward and reverse threshold voltages $V_T^+$ and $V_T^-$ can be achieved accuracy in the ratios among the respective resistance values of the 22, 32 and 46 incorporated in the Schmitt trigger circuit. This means that the Schmitt trigger circuit embodying the present invention can be implemented with ease on a semiconductor integrated circuit.

The bias voltage supply terminal 34 for each of the first and second constant-current network 26 and 42 may be provided by a series circuit composed of a resistor and a forward-biased diode connected between the high-voltage and low-voltage supply lines 10 and 12. In this instance, the bias voltage is obtained from the forward-biased diode. As an alternative, the bias voltage supply terminal 32 may be provided by the difference between the high-voltage and low-voltage supply lines 10 and 12 with use of a voltage divider composed of resistors. In this instance, the fluctuations in the forward and reverse threshold voltages $V_T^+$ and $V_T^-$ as would be caused by the fluctuations in the voltage at each of the high-voltage and low-voltage supply lines 10 and 12 may be practically taken up.

Figure 4:
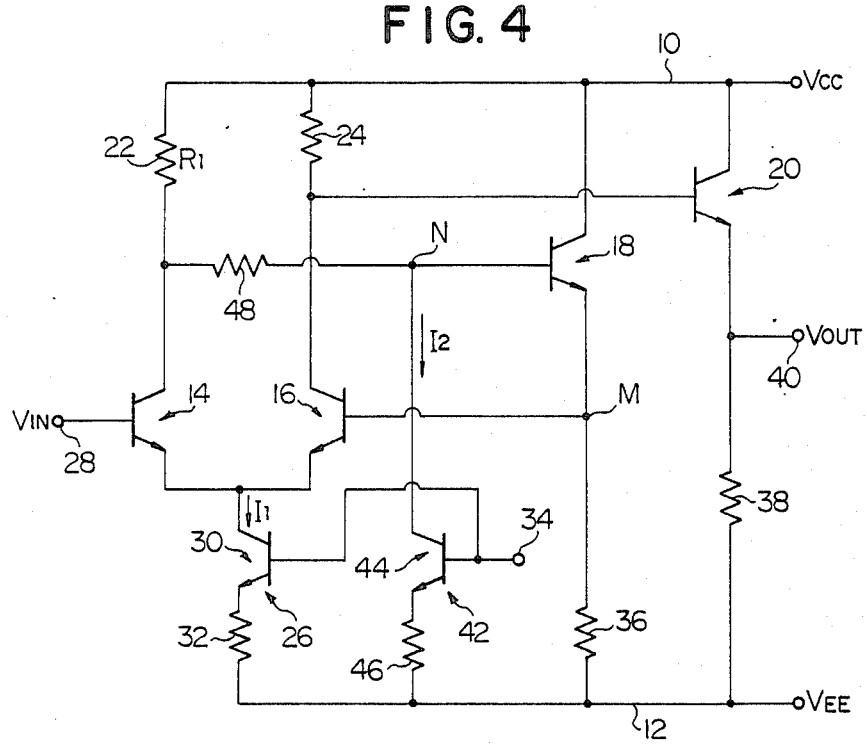
FIG. 4 is a view similar to FIG. 2 but shows a modification of the embodiment illustrated in FIG. 2.

The embodiment hereinbefore described with reference to FIG. 2 is merely for the purpose of illustration of the gist of the present invention and may therefore be modified and/or changed in numerous manners if desired. FIG. 4 of the drawings shows one of such modifications of the described embodiment of a Schmitt trigger circuit according to the present invention. In the embodiment shown in FIG. 4, there is provided an additional resistor 48 connected between the base of the third transistor 18 and each of the resistor 22 and the collector of the first transistor 14.

When the first transistor 14 is turned off, the potential at the node M between the emitter of the third transistor 18 and the base of the second transistor 16 depends not only on the base-emitter voltage $V_{BE3}$ of the third transistor 18 and the voltage across the resistor 22 ($R_1$) but on the voltage across the additional resistor 48 having a resistance value $R_{48}$. Thus, the forward threshold level $V_T^+$ of the input voltage $V_{IN}$ of the Schmitt trigger circuit is given by $$V_T^+ = V_{CC} - I_1(R_1 + R_{48}) + V_{BE3}. \quad \text{Eq. 7}$$

The first transistor 14 being thereafter turned on so that a current totalling $I_1 + I_2$ flows through the resistor 22 ($R_1$) with the predetermined constant current $I_2$ flowing through the additional resistor 48 ($R_{48}$), the reverse threshold level $V_T$ hu − of the input voltage $V_{IN}$ of the Schmitt trigger circuit is given by $$V_T^- = V_{CC} - (I_1 + I_2)R1 + I_1R_{48} + V_{BE3}. \quad \text{Eq. 8}$$

From Eqs. 7 and 8 the hysteresis range $V_H$ between the forward and reverse threshold levels $V_T^+$ and $V_T^-$ of the $V_{IN}$ voltage of the Schmitt trigger circuit is also given by $$V_H = V_T^+ - V_T^- = I_2R_1. \quad \text{Eq. 6}$$

The modified circuit arrangement shown in FIG. 4 is thus advantageous in that the hysteresis range $V_H$ between the forward and reverse threshold levels $V_T^+$ and $V_T^-$ can be adjusted arbitrarily by varying the resistance value of the additional resistor 48 as well as the forward and reverse threshold levels $V_T^+$ and $V_T^-$ of the voltage $V_{IN}$ at the input terminal 28 of the circuit.

What is claimed is:

1. A Schmitt trigger circuit comprising
   (a) an input terminal,
   (b) an output terminal,
   (c) a first voltage supply line at which a first predetermined voltage is to be established,
   (d) a second voltage supply line at which a second predetermined voltage is to be established,
   (e) a first transistor having its base connected to the input terminal,
   (f) a load resistor through which the first transistor has its collector connected to said first voltage supply line,
   (g) a second transistor having its collector connected to said first voltage supply line,
   (h) first constant-current source means through which said first and second transistors have their respective emitters commonly connected to said second supply voltage line,
   (i) a third transistor having its collector connected to the first voltage supply line, its base connected to the first voltage supply line through the load resistor and to the collector of the first transistor and its emitter connected to the base of the second transistor, and
   (j) a second constant-current source through which the third transistor has its base further connected to the second voltage supply line.

2. A Schmitt trigger circuit as set forth in claim 1, wherein said first constant-current source means comprises a transistor having its collector connected to the respective emitters of said first and second transistors, its emitter connected through a resistor to said second voltage supply line and its base connected to a source of a predetermined bias voltage and wherein said second constant-current source means comprises a transistor having its collector connected to said first voltage supply line through said load resistor, its emitter connected through a resistor to said second voltage supply line and its base connected to said source of predetermined bias voltage.

3. A Schmitt trigger circuit as set forth in claim 1, further comprising a resistor connected between said second constant-current source means and each of said load resistor and the collector of said first transistor.

4. A Schmitt trigger circuit comprising
   (a) an input terminal;
   (b) an output terminal;
   (c) a first voltage supply line for supplying a first predetermined voltage;
   (d) a second voltage supply line for supplying a second predetermined voltage;
   (e) a first transistor having its base connected to said input terminal, a collector and an emitter;
   (f) a first load resistor connected between the collector of said first transistor and said first voltage supply line;
   (g) a second transistor having a collector connected to said first voltage supply line, an emitter and a base;
   (h) a second load resistor connected between the collector of said second transistor and said first voltage supply line;
   (i) a first constant-current source connected between the respective emitters of said first and second transistors and said second supply voltage line;
   (j) a third transistor having a collector connected to said first voltage supply line, a base connected to said first load resistor and to the collector of said first transistor and an emitter connected to the base of said second transistor, (k) a fourth transistor having a collector connected to said first voltage supply line, a base connected to the collector of said second transistor and an emitter;

(l) a second constant-current source connected between the base of said third transistor and said second voltage supply line; and (m) means for connecting one of the respective emitters of said third and fourth transistors to said output terminal.

5. A Schmitt trigger circuit as set forth in claim 4, wherein said first constant-current source means comprises a transistor having its collector connected to the respective emitters of said first and second transistors, its emitter connected through a resistor to said second voltage supply line and its base connected to a source of a predetermined bias voltage and wherein said second constant-current source means comprises a transistor having its collector connected to said first voltage supply line through said load resistor, its emitter connected through a resistor to said second voltage supply line and its base connected to said source of predetermined bias voltage.

6. A Schmitt trigger circuit as set forth in claim 4, further comprising a resistor connected between said second constant-current source means and each of said first load resistor and the collector of said first transistor.

* * * * *

UNITED STATES PATENT AND TRADEMARK OFFICE
CERTIFICATE OF CORRECTION

PATENT NO. : 4,694,198

DATED : September 15, 1987

INVENTOR(S) : Yoshitaka Umeki

It is certified that error appears in the above-identified patent and that said Letters Patent is hereby corrected as shown below:

Column 7, line 1, after "achieved" insert --by achieving--.

Column 7, line 49, after "threshold level $V_T$" delete "hu".

Column 8, line 6, delete "voltage'" and insert therefor --voltage--.

Signed and Sealed this

Nineteenth Day of July, 1988

*Attest:*

DONALD J. QUIGG

*Attesting Officer*   *Commissioner of Patents and Trademarks*